(12) United States Patent
Liu et al.

(10) Patent No.: US 10,784,467 B2
(45) Date of Patent: Sep. 22, 2020

(54) THIN FILM PACKAGING STRUCTURES AND DISPLAY DEVICES

(71) Applicant: Kunshan Go-Visionox Opto-Electronics Co., Ltd., Kunshan (CN)

(72) Inventors: Mingxing Liu, Kunshan (CN); Xuliang Wang, Kunshan (CN); Shuaiyan Gan, Kunshan (CN); Xuan Zhang, Kunshan (CN); Feng Gao, Kunshan (CN)

(*) Notice: Subject to any disclaimer, the term of this patent is extended or adjusted under 35 U.S.C. 154(b) by 0 days.

(21) Appl. No.: 16/413,635

(22) Filed: May 16, 2019

(65) Prior Publication Data
US 2019/0273221 A1 Sep. 5, 2019

Related U.S. Application Data

(63) Continuation of application No. PCT/CN2018/113504, filed on Nov. 1, 2018.

(30) Foreign Application Priority Data

May 11, 2018 (CN) .......................... 2018 1 0450167

(51) Int. Cl.
*H01L 51/52* (2006.01)
*H01L 27/32* (2006.01)
(Continued)

(52) U.S. Cl.
CPC .......... *H01L 51/5256* (2013.01); *B32B 3/266* (2013.01); *H01L 27/3241* (2013.01);
(Continued)

(58) Field of Classification Search
CPC . H01L 51/5256; H01L 51/5253; H01L 51/56; H01L 27/3241; B32B 3/266
See application file for complete search history.

(56) References Cited

U.S. PATENT DOCUMENTS

| 5,895,228 A | 4/1999 | Biebuyck et al. |
| 2014/0152174 A1 | 6/2014 | Wang et al. |

(Continued)

FOREIGN PATENT DOCUMENTS

| CN | 103137654 A | 6/2013 |
| CN | 103872257 A | 6/2014 |

(Continued)

OTHER PUBLICATIONS

CN Second Office Action with Search report dated Jun. 20, 2019 in the corresponding CN appiication (application No. 201810450167.6).

(Continued)

*Primary Examiner* — Anne M Hines
(74) *Attorney, Agent, or Firm* — Ilpatrick Townsend & Stockton

(57) ABSTRACT

The present disclosure relates to a thin film packaging structure, which includes at least one first composite film layer. The first composite film layer includes at least one first organic film layer and at least one mesh cushioning layer. A surface of at least part of the first organic film layers is provided with the mesh cushioning layer, and/or at least part of the first organic film layers is embedded with the mesh cushioning layer. According to applying the thin film packaging structure of the present disclosure, the mesh cushioning layer has better flexibility. During cutting process or under the influence of external forces, the mesh cushioning layer can effectively cushion stress acting on a display screen, and reduce stress propagation along a direction perpendicular to a thickness direction of the display screen, thereby avoiding cracking of the display screen effectively. The present disclosure further relates to a display device.

19 Claims, 3 Drawing Sheets

(51) Int. Cl.
  *H01L 51/56* (2006.01)
  *B32B 3/26* (2006.01)
(52) U.S. Cl.
  CPC .......... *H01L 51/5253* (2013.01); *H01L 51/56* (2013.01); *B32B 2305/38* (2013.01)

(56) References Cited

U.S. PATENT DOCUMENTS

| | | | |
|---|---|---|---|
| 2014/0167006 A1 | 6/2014 | Kim | |
| 2018/0212191 A1 | 7/2018 | Jin | |
| 2018/0309088 A1* | 10/2018 | Gong | H01L 51/56 |
| 2018/0375060 A1 | 12/2018 | Li et al. | |

FOREIGN PATENT DOCUMENTS

| | | |
|---|---|---|
| CN | 105552246 A | 5/2016 |
| CN | 105977398 A | 9/2016 |
| CN | 106384743 A | 2/2017 |
| CN | 106848106 A | 6/2017 |
| CN | 107170902 A | 9/2017 |
| CN | 207021320 U | 2/2018 |
| CN | 107909927 A | 4/2018 |
| CN | 108232029 A | 6/2018 |
| CN | 108257982 A | 7/2018 |
| CN | 108638621 A | 10/2018 |

OTHER PUBLICATIONS

CN Fourth Office Action with search report dated Nov. 15, 2019 in the corresponding CN application (application No. 201810450167.6).

Li Xiaolin, "Study on the Improvement of Measurement Performance of Graphene in the Application of Thermocouple", in Mar. 2017, 2 pages.

Ma Jingjing et al., "Graphene-based Energy Materials for Smart Grid", in Aug. 2016, 17 pages.

"Application of Carbon Materials in Supercapacitors", in Jan. 2013.

CN First Office Action dated Mar. 6, 2019 in the corresponding to CN application (application No. 201810450167.6).

* cited by examiner

THIN FILM PACKAGING STRUCTURES AND DISPLAY DEVICES

CROSS-REFERENCES TO RELATED APPLICATIONS

This application is a continuation application of International Application PCT/CN2018/113504, filed on Nov. 1, 2018, which claims priority of Chinese Patent Application No. 201810450167.6, filed with the CNIPA on May 11, 2018, entitled "THIN FILM PACKAGING STRUCTURE AND DISPLAY DEVICE", and the entire contents of the both applications are incorporated herein in their entirety.

FIELD

Exemplary embodiments of the present disclosure relate to display, in particular to thin film packaging structures and display devices.

BACKGROUND

With the development of information technology, display devices such as mobile phones have become an indispensable tool in people's lives, and "full screen" has become the pursuit for more and more users. In the conventional technology, a non-display region is spared in a display region of a display screen, and is slotted to spare positions of a camera and an earpiece, thereby realizing an ultra-high screen ratio of a display device.

SUMMARY

Accordingly, it is needed to provide a thin film packaging structure that can avoid cracks of a display screen effectively.

According to an aspect of exemplary embodiments of the present disclosure, a thin film packing structure is provided. The thin film packaging structure includes at least a first composite film layer. The first composite film layer includes at least a first organic film layer and at least a mesh cushioning layer. A surface of at least a part of the first organic film layers is provided with the mesh cushioning layer, and/or at least a part of the first organic film layers is embedded with the mesh cushioning layer.

In an embodiment, a side surface of the first organic film layer is embedded with the mesh cushioning layer. A first side surface of the mesh cushioning layer is located inside the first organic film layer, and a second side surface of the mesh cushioning layer is coplanar with the surface of the first organic film layer in which the mesh cushioning layer is embedded.

In an embodiment, two side surfaces of the first organic film layer are embedded respectively with one mesh cushioning layer. A first side surface of each of the mesh cushioning layers is located inside the first organic film layer, and a second side surface of the mesh cushioning layer is coplanar with the surface of the first organic film layer in which the mesh cushioning layer is embedded.

In an embodiment, the first composite film layer includes a plurality of first organic film layers laminated, and the mesh cushioning layer is provided between at least two adjacent organic film layers to form a sandwich layer.

In an embodiment, a material of the mesh cushioning layer is selected from any one of polyethylene, polypropylene, polymethyl methacrylate and graphene material.

In an embodiment, meshes in the mesh cushioning layer are arranged in an array along a direction perpendicular to a thickness direction of the first composite film layer.

In an embodiment, the thin film packaging structure further includes a plurality of inorganic film layers, and at least one first composite film layer is provided between at least two adjacent inorganic film layers.

In an embodiment, the thin film packaging structure includes one first composite film layer and two inorganic film layers, and the first composite film layer is arranged between the two inorganic film layers.

In an embodiment, the thin film packaging structure includes a plurality of inorganic film layers and a plurality of first composite film layers, and the plurality of inorganic film layers and the plurality of first composite film layers are laminated alternately.

In an embodiment, a thickness of the mesh cushioning layer is less than a thickness of the first organic film layer.

In an embodiment, the thickness of the mesh cushioning layer ranges from 2 µm to 6 µm.

In an embodiment, each mesh of the mesh cushioning layer is in shape of rhombus, rectangle or hexagon.

In an embodiment, a distance between two opposite edges forming the mesh ranges from 10 µm to 50 µm, and a width of each edge forming the mesh ranges from 5 µm to 10 µm.

In an embodiment, the thin film packaging structure further includes at least one second composite film layer. The second composite film layer includes at least two inorganic film layers and at least one second organic film layer that are laminated, and the at least one second organic film layer is arranged between the at least two adjacent inorganic film layers. The second composite film layer and the first composite film layer are superposed together.

In an embodiment, the thin film packaging structure includes one first composite film layer and one second composite film layer, and the first composite film layer is arranged on an outer side surface of the second composite film layer.

In an embodiment, the first composite film layer includes one first organic film layer and one mesh cushioning layer, and the mesh cushioning layer is embedded in a side surface of the first organic film layer facing the second composite film layer.

In an embodiment, the thin film packaging structure includes a plurality of first composite film layers and a plurality of second composite film layers, and the first composite film layers and the second composite film layers are laminated alternately.

The exemplary embodiments of the present disclosure further provide a display device, which includes the aforedescribed thin film packaging structure.

The exemplary embodiments of the present disclosure further provide a method for forming a thin film packaging structure, which includes:

forming a bottom inorganic film layer on an organic light emitting device;

forming a mesh cushioning layer on the bottom inorganic film layer;

forming a first organic film layer on the bottom inorganic film layer, where the mesh cushioning layer is embedded in the first organic film layer or the mesh cushioning layer is provided in one side surface of the first organic film layer; and forming a top inorganic film layer on the first organic film layer.

In an embodiment, after forming the first organic film layer and before forming the top inorganic film layer, the method further includes planarizing a top surface of the first organic film layer.

According to the thin film packaging structure of the present disclosure, the mesh cushioning layer has better flexibility. During cutting process or under the influence of external forces such as falling or being impacted, the mesh cushioning layer can effectively cushion stress acting on the display screen, and reduce stress propagation along a direction perpendicular to a thickness direction of the display screen, thereby avoiding cracking of the display screen effectively (i.e., improving the strength of the display screen).

According to the display device of the present disclosure, a mesh cushioning layer is embedded in at least one organic film layer in the thin film packaging structure, and the mesh cushioning layer has better flexibility. During cutting process or under the influence of external forces such as falling or being impacted, the mesh cushioning layer can effectively cushion the stress acting on the display screen, and reduce stress propagation along the direction perpendicular to the thickness direction of the display screen, thereby avoiding cracking of the display screen effectively (i.e., improving the strength and the service life of the display screen).

DETAILED DESCRIPTION OF THE INVENTION

In conventional processes, during the cutting process, the display screen is susceptible to occurring stress concentration due to uneven forces, which in serious cases can cause the display screen to crack.

Furthermore, since display devices having "full screen" have a high screen ratio, they are also susceptible to occurring stress concentration due to uneven forces under the influence of external forces such as falling or being impacted, which in serious cases can cause a display screen to crack.

In order to make the objects, technical solutions, and advantages of the present disclosure more comprehensible, the exemplary embodiments of the present disclosure will be described in detail below with reference to the accompanying drawings and embodiments. It can be understood that the detailed embodiments described herein are merely to explain the present disclosure, but not intended to limit the same.

It should be noted that when an element is referred to as being "formed on" another element, it can be formed directly on the other element or an interposing element may be present. The terms "upper", "lower" and the like are used herein merely for the purpose of illustration, and are not intended to refer to an only embodiment.

Unless otherwise defined, all technical and scientific terms as used herein have the same meaning as commonly understood by those skilled in the art to which this disclosure belongs. The terms as used herein in the description of the exemplary embodiments of the present disclosure are for the purpose of describing particular embodiments only, and are not intended to limit the present disclosure. The term "and/or" as used herein includes arbitrary and all combinations of one or more of the associated listed items.

Figure 1:
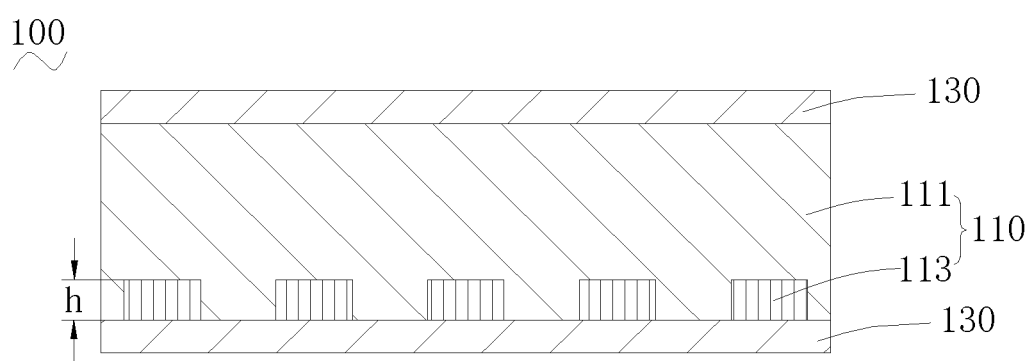
FIG. 1 is a cross-sectional view of a thin film packaging structure in accordance with an embodiment of the present disclosure.
Figure 2:
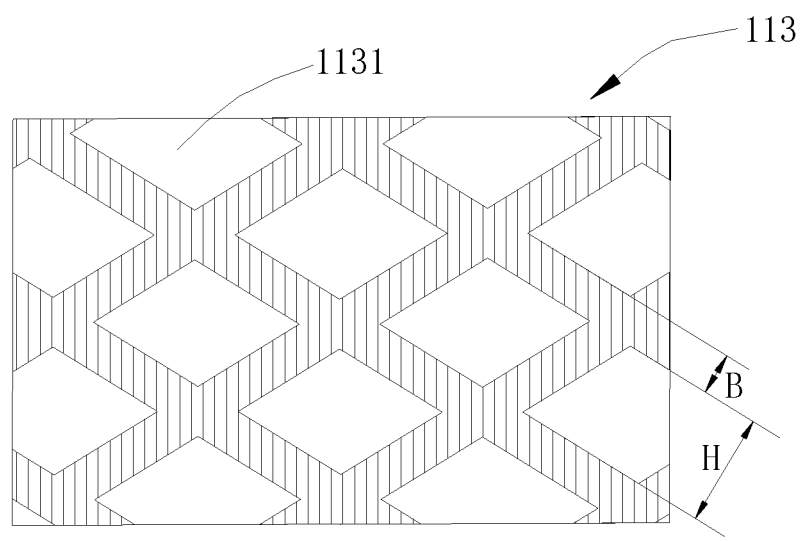
FIG. 2 is a top view of a mesh cushioning layer of FIG. 1.

As illustrated in FIG. 1 and FIG. 2, a thin film packaging structure 100 is provided according to an embodiment of the present disclosure, which serves for example as a component constituting a display screen and is formed by laminating a plurality of film layers. Specifically, in the present embodiment, the thin film packaging structure 100 includes a first composite film layer 110, which includes a first organic film layer 111 and a mesh cushioning layer 113. The mesh cushioning layer 113 is embedded in the first organic film layer 111. For example, two side surfaces (i.e. an upper side surface and a lower side surface in the figure) of the mesh cushioning layer 113 in the figure can be entirely located in the first organic film layer 111 without being exposed, or can also cause at least a side surface of the mesh cushioning layer 113 to be flush with an outer surface of the first organic film layer 111 or to protrude from the outer surface of the first organic film layer 111. Of course, the thin film packaging structure 100 of the present disclosure is not limited thereto. In another embodiment (not shown), the mesh cushioning layer is for example provided on at least one side surface of the first organic film layer 111 in direct contact.

The mesh cushioning layer 113 has a mesh structure to have better flexibility. During cutting process or under the influence of external forces such as falling or being impacted, the mesh cushioning layer 113 can effectively cushion the stress acting on the display screen, and reduce stress propagation along a direction perpendicular to a thickness direction of the display screen, thereby avoiding cracking of the display screen effectively, i.e. improving the strength of the display screen.

In the embodiment, a thickness of the mesh cushioning layer 113 is less than a thickness of the first organic layer, and the mesh cushioning layer 113 is embedded in a side surface region of the first organic film layer 111. As seen in FIG. 1, a first side surface of the mesh cushioning layer 113 is located in the first organic film layer 111, and a second side surface of the mesh cushioning layer 113 is coplanar with the side surface of the first organic film layer 111 in which the mesh cushioning layer 113 is embedded, and this structure is easier to implement in the process. In an embodiment, the surface of the mesh cushioning layer 113 that is coplanar with the first organic film layer 111 is a surface proximate to an organic light emitting device. It is understood that the surface of the mesh cushioning layer 113 that is coplanar with the first organic film layer 111 is perpendicular to a thickness direction of the first composite film layer 110.

While one first composite film layer 110 includes one first organic film layer 111 and one mesh cushioning layer 113 in this embodiment, one first composite film layer 110 can also include a plurality of first organic film layers 111 and at least one mesh cushioning layer 113 in another embodiment. It is understood that the plurality of first organic film layers 111 are laminated, and a planar on which each of the first organic film layers 111 is located is substantially perpendicular to the thickness direction of the first composite film layer 110. In an embodiment, a planar on which the mesh cushioning layer 113 is located is substantially perpendicular to the thickness direction of the first composite film layer 110. In this case, the mesh cushioning layer may be provided between at least two adjacent organic film layers to form a sandwich layer. It is possible to embed at least one mesh cushioning layer 113 (e.g., embedding one mesh cushioning layer in a side surface of at least one first organic film layer, or embedding one mesh cushioning layer respectively in two side surfaces of at least one first organic film layer) in at least part (e.g., one layer) of the first organic film layers 111, or embed at least one mesh cushioning layer 113 respectively in each of the first organic film layer 111, or arrange (e.g., clamp) one mesh cushioning layer 113 between at least two adjacent first organic film layers 111, or embed one mesh cushioning layer 113 in at least two first organic film layer 111 simultaneously. Furthermore, in other embodiments, a plurality of mesh cushioning layers 113 can be embedded in one first organic film layer 111 simultaneously.

The material of the mesh cushioning layer 113 is for example selected from any one of polyethylene, polypropylene, polymethyl methacrylate and graphene material. Of course, the mesh cushioning layer 113 can also be made of other flexible materials.

In this embodiment, meshes 1131 of the mesh cushioning layer 113 are arranged in an array on a planar perpendicular to the thickness direction of the first composite film layer 110, thereby causing the flexibility of the mesh cushioning layer 113 substantially uniform at each points. Of course, it is possible to adjust the density and arrangement of the meshes in the mesh cushioning layer 113 according to the case of stress concentration generated by the display screen under external forces, so as to cushion the stress acting on the display screen better.

In this embodiment, the thin film packaging structure 100 further includes two inorganic film layers 130, between which the first composite film layer 110 is arranged. Of course, in other embodiments, the thin film packaging structure 100 can further include more than two inorganic film layers 130 and more than one first composite film layer 110. The layer number of the inorganic film layer 130 is, for example, three or four, and one first composite film layer 110 can be provided between at least two adjacent inorganic film layers 130. Of course, in some embodiments, it is also possible to laminate a plurality of inorganic film layers 130 and a plurality of first composite film layers 110 alternately, or provide one composite film layer 110 on an outer surface of one inorganic film layer from the plurality of inorganic film layers 130.

In this embodiment, each mesh 1131 of the mesh cushioning layer 113 is in shape of rhombus. Of course, the shape of each mesh 1131 of the mesh cushioning layer 113 is not limited to rhombus, but also can be other shapes, such as rectangle, square, circle, hexagon, etc. It should be noted that a filled portion in FIG. 2 is a mesh cushioning layer 113 (also used to form the edge of the mesh 1131), and no mesh cushioning layer material is present in the mesh 1131. In this embodiment, the mesh 1131 is filled with the material of the first organic film layer 111.

A thickness of the mesh cushioning layer 113 is less than the thickness of the first composite film layer 110. In an embodiment, the thickness of the mesh cushioning layer 113 located between two adjacent inorganic film layers 130 is less than the thickness of the first organic film layer 111 located between the two adjacent inorganic film layers 130, thereby ensuring the tightly bonding of the first organic film layer 111 and the inorganic film layers 130, thus securing the packaging effect of the thin film packaging structure 100. In general, the thickness of the first composite film layer 110 ranges from 8 µm to 12 µm. Under the influence of the thickness of the first composite film layer 110, the thickness h of the mesh cushioning layer 113 ranges from 2 µm to 6 µm. For example, when the thickness of the first composite film layer 110 is 8 µm, the thickness h of the mesh cushioning layer 113 is 2 µm. In an embodiment, in the case where the aforementioned thickness of the mesh cushioning layer 113 is satisfied, in order to cause the mesh cushioning layer 113 to have better flexibility and to be able to better cushion stress, a distance H between two opposite edges of the mesh cushioning layer 113 for forming the mesh 1131 ranges from 10 µm to 50 µm, and a width B of an edge of the mesh cushioning layer 113 for forming the mesh 1131 ranges from 5 µm to 10 µm.

In this embodiment, a whole region of one side surface of the first organic film layer 111 is embedded with one mesh cushioning layer 113. Of course in other embodiments, it is possible to provide one mesh cushioning layer 113 as required at the position where it is susceptible to occurring stress concentration, or provide more mesh cushioning layers 113 at the position where it is susceptible to occurring stress concentration, or embed one mesh cushioning layer respectively in two side surfaces of the first organic film layer 111 etc. All these arrangements for the mesh cushioning layer 113 fall within the protection scope of the present disclosure.

It should be noted that the thin film packaging structure 100 is generally used to package an organic light emitting device of a display screen to insulate moisture and oxygen. In the thin film packaging structure 100, the inorganic film layer 130 can effectively insulate moisture and oxygen. Therefore, in this embodiment, the bottommost layer and the topmost layer of the thin film packaging structure 110 are both inorganic film layers 130, the strength of the display screen can be improved by providing the first composite film layer 110 between the two inorganic film layers 130 without increasing the thickness of the thin film packaging structure 100.

A method for forming the thin film packaging structure 100 is briefly described below.

In step S01, an inorganic film layer 130 (i.e. a bottom inorganic film layer) is formed on an organic light emitting device.

In step S02, a mesh cushioning layer 113 is formed on the bottom inorganic film layer.

Specifically, when the mesh cushioning layer 113 is made of the materials such as polyethylene, polypropylene, polymethyl methacrylate, etc., the mesh cushioning layer 113 can be formed by exposure development deposition using a mask. When the mesh cushioning layer 113 is made of graphene, the mesh cushioning layer 113 can be formed by inkjet printing. Of course, the mesh cushioning layer 113 can also be formed on the bottom inorganic film layer in other ways according to different materials of the mesh cushioning layer 113.

In step S03, a first organic film layer 111 is formed by inkjet printing or the like.

It can be understood that in order to ensure that a bonding surface of the first organic film layer 111 with the top inorganic film layer is a planar, planarization is required to be performed after the first organic film layer 111 is formed. Alternatively, when forming the first organic film layer 111, a corresponding amount of organic material is ejected according to the position of the mesh cushioning layer 113, thereby ensuring the upper surface of the first organic film layer to be a planar to be well bonded to a top inorganic film layer.

In step S04, an inorganic film layer 130 (i.e. the top inorganic film layer) is formed on the first organic film layer 111, thereby completing the packaging of the organic light emitting device.

Of course, when the thin film packaging structure 100 includes a plurality of first composite film layers 110 and a plurality of inorganic film layers 130, the step S02, step S03, and step S04 can be repeated.

Figure 3:
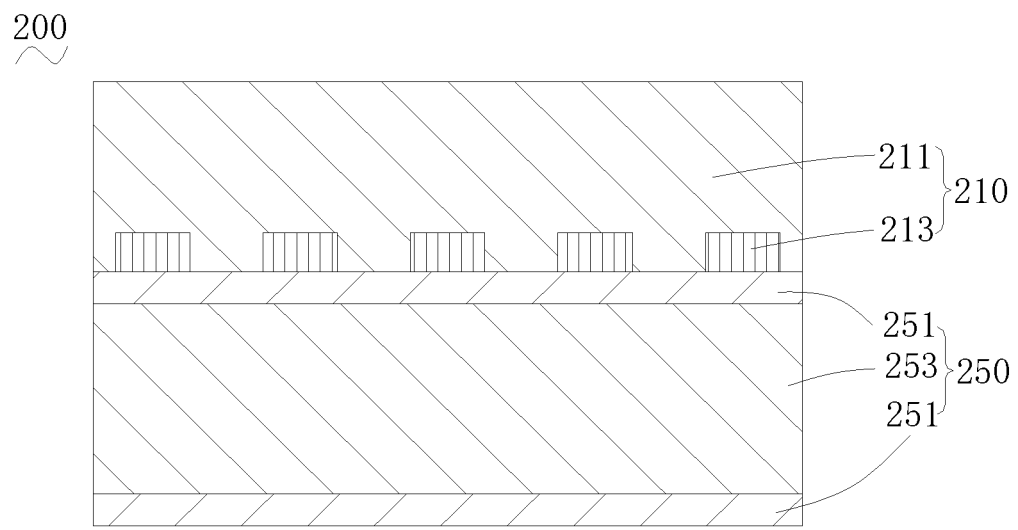
FIG. 3 is a cross-sectional view of a thin film packaging structure in accordance with another embodiment of the present disclosure.

FIG. 3 illustrates a thin film packaging structure 200 provided according to another embodiment of the present disclosure, which includes one first composite film layer 210 and one second composite film layer 250. In this embodiment, the one second composite film layer 250 includes laminated two inorganic film layers 251 and one second organic film layer 253, and the second organic film layer 253 is located between two adjacent inorganic film layers 251. The first composite film layer 210 is superposed on a side surface of the second composite film layer 250.

The specific structure of the first composite film layer 210 can refer to the structure of the first composite film layer 110 according to the afore-described embodiments. Specifically, the first composite film layer 210 includes a first organic film layer 211 and a mesh cushioning layer 213. The mesh cushioning layer 213 is embedded in a side surface of the first organic film layer 211.

It can be understood that in other embodiments, the thin film packaging structure can include a plurality of first composite film layers 210 and a plurality of second composite film layers 250, one first composite film layer 210 can include at least one first organic film layer 211 and at least one mesh cushioning layer 213, and one second composite film layer 250 can include at least two inorganic film layers 251 and at least one second organic film layer 253. The plurality of first composite film layers 210 and the plurality of second composite film layers 250 are laminated alternately.

The aforementioned second composite film layer 250 is a conventional structure of a thin film packaging structure in the field of display screen manufacturing, which can be manufactured by using conventional equipment and processes, thereby reducing requirements for equipment and process. In this embodiment, introducing the first composite film layer 210 into the conventional thin film packaging structure and superposing the first composite film layer 210 on a side surface of the second composite film layer 250 are equivalent to introducing a layer structure (i.e., the first composite film layer 210) having better flexibility into the conventional thin film packaging structure (which includes only the second composite film layer 250). During cutting process or under the influence of external forces such as falling or being impacted, the layer structure having better flexibility can effectively cushion stress, and reduce stress propagation along the direction perpendicular to the thickness direction of the display screen, thereby effectively avoiding cracking of the display screen and effectively improving the strength of the display screen.

In this embodiment, the thin film packaging structure 200 includes one first composite film layer 210 and one second composite film layer 250 superposed together, that is a side surface of the first composite film layer 210 is arranged oppositely to the second composite film layer 250, and the other side surface of the first composite film layer 210 is provided without any inorganic film layer. In an embodiment, the surface of the first composite film layer 210 to be embedded with the mesh cushioning layer 213 is arranged oppositely to the second composite film layer 250. Since the first composite film layer 210 is superposed on one side surface of the second composite film layer 250, which is equivalent to adding the first composite film layer 210 on the outermost side of a conventional thin film packaging structure. In this way, on one hand, it is possible to add only the equipment for forming the first composite film layer 210 without changing the original production equipment for the conventional thin film packaging structure, which is advantageous for reducing the influence on the production cost of products, and on the other hand, and the strength of the conventional thin film packaging structure can be effectively improved. Furthermore, the packaging effect of the thin film packaging structure can be better ensured.

It can be understood that the first composite film layer 210 herein is provided only to facilitate adding the mesh cushioning layer 213. Therefore, the thickness of the first organic film layer 211 can be set according to the thickness of the mesh cushioning layer 213, that is, the thickness of the first organic film layer 211 can be thicker. In an embodiment, the thickness of the mesh cushioning layer 213 ranges from 2 μm to 100 μm.

Similarly, in this embodiment, each mesh of the mesh cushioning layer 213 is in shape of rhombus. Of course, the shape of each mesh of the mesh cushioning layer 213 is not limited to rhombus, and can be other shapes, such as rectangle, square, circle, hexagon, etc. Accordingly, the edge of the mesh cushioning layer 213 forming a mesh has a width ranging from 5 μm to 100 μm. The distance between two opposite edges of the mesh cushioning layer 250 forming a mesh ranges from 10 μm to 100 μm.

Of course, according to another embodiment, the thin film packaging structure can also include a plurality of the second composite film layers 250, and the first composite film layer 210 is located between any two adjacent second composite film layers or located on the outermost layer of the thin film packaging structure.

In another embodiment, the thin film packaging structure can also include at least one second composite film layer, at least one first composite film layer, and at least one inorganic film layer, and one first composite film layer is arranged between one second composite film layer and one inorganic film layer that are adjacent.

Exemplary embodiments of the present disclosure further provide a display device, which includes the thin film packaging structure provided in the present disclosure. The display device provided by the exemplary embodiments of the present disclosure, can be a display screen provided separately, or a display terminal including the display screen. The thin film packaging structure is a component of the display screen.

According to the display device of the present disclosure, a mesh cushioning layer is embedded in at least one organic film layer in the thin film packaging structure, or a surface of the at least one organic film layer is in direct contact with the mesh cushioning layer. When the display screen is in the cutting process or under the influence of external forces such as falling or being impacted, the mesh cushioning layer can effectively cushion the stress, and reduce stress propagation along the direction perpendicular to the thickness direction of the display screen, thereby avoiding cracking of the display screen effectively, i.e. improving the strength of the display screen.

The forgoing embodiments are merely illustrative of several implementations of the present disclosure, and the description thereof is more specific and detailed, but should not be construed as limitations to the scope of the present disclosure. It should be noted that for those of ordinary skill in the art, variations and improvements can be made without departing from the concept of the present disclosure, which fall within the scope of the present disclosure. Therefore, the scope of the present disclosure is defined by the appended claims.

The invention claimed is:

1. A thin film packaging structure, comprising:
 at least one first composite film layer, each of the at least one first composite film layer comprising a first organic film layer and a mesh cushioning layer,
 wherein at least a part of a surface of each of the at least one first organic film layer is embedded with the mesh cushioning layer, wherein a thickness of the mesh cushioning layer is less than a thickness of the first organic film layer.

2. The thin film packaging structure of claim 1, wherein:
 a side surface of the first organic film layer is embedded with the mesh cushioning layer,
 a first side surface of the mesh cushioning layer is located inside the first organic film layer, and
 a second side surface of the mesh cushioning layer is coplanar with the surface of the first organic film layer in which the mesh cushioning layer is embedded.

3. The thin film packaging structure of claim 1, wherein:
 two side surfaces of the first organic film layer are embedded with one mesh cushioning layer respectively,
 a first side surface of each of the mesh cushioning layers is located inside the first organic film layer, and
 a second side surface of the mesh cushioning layer is coplanar with the surface of the first organic film layer in which the mesh cushioning layer is embedded.

4. The thin film packaging structure of claim 1, wherein the first composite film layer comprises a plurality of first organic film layers laminated; and
 the mesh cushioning layer is provided between at least two adjacent organic film layers to form a sandwich layer.

5. The thin film packaging structure of claim 1, wherein a material of the mesh cushioning layer is selected from any one of polyethylene, polypropylene, polymethyl methacrylate, and graphene material.

6. The thin film packaging structure of claim 1, wherein meshes of the mesh cushioning layer are arranged in an array along a direction perpendicular to a thickness direction of the first composite film layer.

7. The thin film packaging structure of claim 1, further comprising a plurality of inorganic film layers, wherein the at least one first composite film layer is provided between at least two adjacent inorganic film layers.

8. The thin film packaging structure of claim 1, wherein the thin film packaging structure comprises the one first composite film layer and two inorganic film layers, and the first composite film layer is provided between the two inorganic film layers.

9. The thin film packaging structure of claim 1, wherein the thin film packaging structure comprises a plurality of inorganic film layers and a plurality of first composite film layers, and the plurality of inorganic film layers and the plurality of first composite film layers are laminated alternately.

10. The thin film packaging structure of claim 1, wherein the thickness of the mesh cushioning layer ranges from 2 μm to 6 μm.

11. The thin film packaging structure of claim 1, wherein each mesh of the mesh cushioning layer is in shape of rhombus, rectangle or hexagon.

12. The thin film packaging structure of claim 11, wherein a distance between two opposite edges forming the mesh ranges from 10 μm to 50 μm, and a width of each edge forming the mesh ranges from 5 μm to 10 μm.

13. The thin film packaging structure of claim 1, further comprising at least one second composite film layer, wherein the second composite film layer comprises at least two inorganic film layers and at least one second organic film layer that are laminated, and the at least one second organic film layer is arranged between the at least two adjacent inorganic film layers; the second composite film layer and the first composite film layer are superposed together.

14. The thin film packaging structure of claim 13, wherein the thin film packaging structure comprises one first composite film layer and the one second composite film layer, and the first composite film layer is arranged on an outer side surface of the second composite film layer.

15. The thin film packaging structure of claim 14, wherein the first composite film layer comprises one first organic film layer and one mesh cushioning layer, and the mesh cushioning layer is embedded in a side surface of the first organic film layer facing the second composite film layer.

16. The thin film packaging structure of claim 13, wherein the thin film packaging structure comprises a plurality of first composite film layers and a plurality of second composite film layers, wherein the first composite film layers and the second composite film layers are laminated alternately.

17. A display device, comprising the thin film packaging structure of claim 1.

18. A method for forming a thin film packaging structure, comprising:
 forming a bottom inorganic film layer on an organic light-emitting device;
 forming a mesh cushioning layer on the bottom inorganic film layer;
 forming a first organic film layer on the bottom inorganic film layer, wherein the mesh cushioning layer is embedded in the first organic film layer or the mesh cushioning layer is provided in a side surface of the first organic film layer; and
 forming a top inorganic film layer on the first organic film layer.

19. The method for forming a thin film packaging structure of claim 18, wherein after forming the first organic film layer and before forming the top inorganic film layer, the method further comprises planarizing a top surface of the first organic film layer.

* * * * *